US012532752B2

(12) United States Patent
Chou et al.

(10) Patent No.: US 12,532,752 B2
(45) Date of Patent: Jan. 20, 2026

(54) PACKAGES WITH MULTIPLE EXPOSED PADS

(71) Applicant: TEXAS INSTRUMENTS INCORPORATED, Dallas, TX (US)

(72) Inventors: Hung-Yu Chou, Dallas, TX (US); Bo-Hsun Pan, New Taipei (TW); Yuh-Harng Chien, New Taipei (TW); Fu-Hua Yu, New Taipei (TW); Steven Alfred Kummerl, Carrollton, TX (US); Jie Chen, Plano, TX (US); Rajen M. Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/453,999

(22) Filed: Aug. 22, 2023

(65) Prior Publication Data

US 2023/0395472 A1 Dec. 7, 2023

Related U.S. Application Data

(62) Division of application No. 16/206,640, filed on Nov. 30, 2018, now Pat. No. 11,735,506.

(60) Provisional application No. 62/671,775, filed on May 15, 2018.

(51) Int. Cl.
*H01L 23/495* (2006.01)
*H01L 21/48* (2006.01)
*H01L 21/56* (2006.01)
*H01L 23/31* (2006.01)

(52) U.S. Cl.
CPC .... *H01L 23/49568* (2013.01); *H01L 21/4821* (2013.01); *H01L 21/565* (2013.01); *H01L 23/3107* (2013.01); *H01L 23/49503* (2013.01)

(58) Field of Classification Search
None
See application file for complete search history.

(56) References Cited

U.S. PATENT DOCUMENTS

| 4,994,412 | A | 2/1991 | Kalfus et al. |
|---|---|---|---|
| 5,396,172 | A | 3/1995 | Lat et al. |
| 7,847,391 | B2 | 12/2010 | Udompanyavit et al. |
| 8,035,221 | B2 | 10/2011 | Cruz |
| 8,193,618 | B2 | 6/2012 | Madrid |
| 8,324,721 | B2 | 12/2012 | Udompanyavit et al. |
| 10,186,354 | B2 | 1/2019 | Shinotake |
| 2003/0094707 | A1 | 5/2003 | Howarth |
| 2003/0205801 | A1 | 11/2003 | Baik et al. |
| 2004/0173899 | A1* | 9/2004 | Peng ................ H01L 23/4952 257/E23.128 |
| 2008/0084201 | A1 | 4/2008 | Kojori |

(Continued)

*Primary Examiner* — Xiaoming Liu
(74) *Attorney, Agent, or Firm* — Ronald O. Neerings; Frank D. Cimino (57) ABSTRACT

In an example, an apparatus comprises a lead frame that includes a first row of leads, a first pad coupled to the first row of leads, and a second row of leads parallel to the first row of leads. The lead frame also includes a second pad coupled to the second row of leads. The first and second pads are separated by a gap, and each of the first and second pads has a substantially uniform thickness. The apparatus also includes a device coupled to the first and second pads. The first and second pads are exposed to an exterior of the apparatus.

23 Claims, 8 Drawing Sheets (56) References Cited

U.S. PATENT DOCUMENTS

| | | | |
|---|---|---|---|
| 2009/0079051 A1* | 3/2009 | Amano | H01L 24/83 |
| | | | 257/676 |
| 2012/0086112 A1* | 4/2012 | Amaro | H01L 23/495 |
| | | | 257/674 |
| 2014/0367739 A1 | 12/2014 | Muto et al. | |
| 2016/0172281 A1* | 6/2016 | Tsai | H01L 23/495 |
| | | | 257/676 |
| 2017/0317013 A1* | 11/2017 | Yue | G01R 1/203 |
| 2018/0233438 A1* | 8/2018 | Bemmerl | H01L 23/49524 |

* cited by examiner

PACKAGES WITH MULTIPLE EXPOSED PADS

CROSS-REFERENCE TO RELATED APPLICATIONS

The present application is a divisional of application Ser. No. 16/206,640 filed Nov. 30, 2018, now U.S. patent Ser. No. 11/735,506, which claims priority to U.S. Provisional Patent Application No. 62/671,775, which was filed May 15, 2018, is titled "Extended Exposed Pad Feature. For Zero Shunt Resistivity Shift," and is hereby incorporated herein by reference in its entirety.

SUMMARY

In an example, an apparatus comprises a lead frame that includes a first row of leads, a first pad coupled to the first row of leads, and a second row of leads parallel to the first row of leads. The lead frame also includes a second pad coupled to the second row of leads. The first and second pads are separated by a gap, and each of the first and second pads has a substantially uniform thickness. The apparatus also includes a device coupled to the first and second pads. The first and second pads are exposed to an exterior of the apparatus.

In an example, an apparatus comprises a lead frame including a first lead and a first pad coupled to the first lead and comprising a first recessed area and a first non-recessed area. The lead frame also comprises a second lead and a second pad coupled to the second lead and comprising a second recessed area and a second non-recessed area. The first and second recessed areas are separated by a first gap. The apparatus comprises a device coupled to the first and second non-recessed areas. The device is separated from the first recessed area by a second gap and the device is separated from the second recessed area by a third gap. The first and second pads are exposed to an exterior of the apparatus.

In an example, a method comprises fabricating a lead frame including first and second leads. A first pad couples to the first lead and a second pad couples to the second lead. The first and second pads are separated by a gap. The method also comprises coupling a device to the first and second pads. The method further includes applying a mold compound to the lead frame and the device. The first and second pads are exposed to an exterior of the mold compound.

BRIEF DESCRIPTION OF THE DRAWINGS

For a detailed description of various examples, reference will now be made to the accompanying drawings in which.

DETAILED DESCRIPTION

During manufacture, semiconductor chips (also commonly referred to as "dies") are typically mounted on die pads of lead frames and are wire-bonded, clipped, or otherwise coupled to leads of the lead frame. Other devices may similarly be mounted on a lead frame pad. The entire assembly is later encapsulated in a mold compound, such as epoxy, to protect the assembly from potentially damaging heat, physical trauma, and other deleterious factors. The finished, encapsulated assembly is called a semiconductor package or, more simply, a package.

Packages suffer from various design flaws that can result in suboptimal performance. For example, devices within the package, such as the dies and other devices mentioned above, generate heat. To protect the integrity of the package and its contents, this heat should be dissipated out of the package. If the heat is not adequately removed, various parts of the package may be irreparably damaged. In addition, when devices such as dies and other devices are coupled to lead frames, viscous materials—particularly solder—are often used to establish the connection. The solder, however, can undesirably flow into certain areas of the package or lead frame, resulting in functional or cosmetic defects.

This disclosure presents packages that resolve the aforementioned problems. In examples, the disclosed packages include lead frames with multiple leads and die pads coupled to the leads. The die pads are physically separated by a gap and are exposed to an exterior of the package. In some examples, each of the die pads has a substantially uniform thickness. In other examples, each of the die pads has a recessed area and a non-recessed area. The package includes a device (e.g., a shunt, a die, or other suitable device) coupled to the die pads. In examples including die pads with recessed and non-recessed areas, the device couples directly to the non-recessed areas but does not couple directly to the recessed areas. The devices can be used for any suitable purpose. For example, in the case of a shunt device, current flowing through the shunt can be measured by detecting a differential voltage across the shunt. In this way, the package containing the shunt is usable as a current measurement device.

Figure 1:
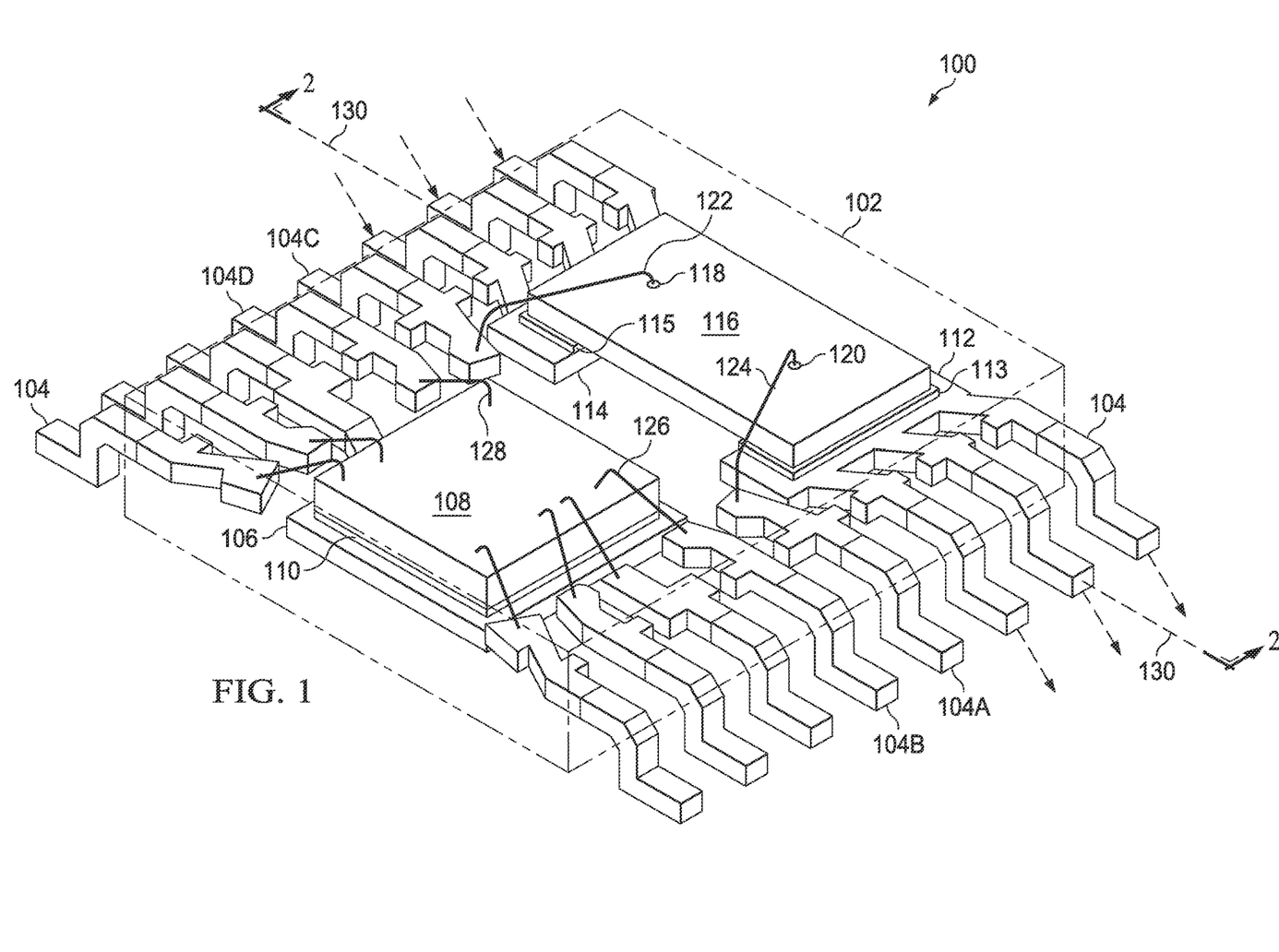
FIG. 1 is a perspective view of contents of a package with multiple exposed pads, in accordance with various examples.

FIG. 1 is a perspective view of contents of a package 100 with multiple exposed pads, in accordance with various examples. The package 100 comprises a mold compound 102 and leads 104 extending from within the mold compound 102. The mold compound 102 encases various components, including a die pad 106; a die 108 (e.g., controller integrated circuit) coupled to the die pad 106 using an adhesive 110 (e.g., solder); a pad 112; a pad 114; and a heat-generating device 116 (e.g., a shunt or a die) coupled to the pads 112, 114 using adhesives 113, 115 (e.g., solder). In an example, the pad 112 has a substantially uniform thickness (e.g., 200 microns; ranging between 100 and 400 microns). In an example, the pad 114 has a substantially uniform thickness (e.g., 200 microns; ranging between 100 and 400 microns). Sense pins 118, 120, which are electrically conductive pins or wire bonds (e.g., solder), couple to the heat-generating device 116. Wire 124 couples sense pin 120 to lead 104A. Wire 122 couples sense pin 118 to lead 104C. Wire 126 couples the die 108 to lead 104B. Wire 128 couples the die 108 to lead 104D. In some examples, the leads 104 are gullwing leads, although the scope of this disclosure is not limited as such.

In some examples, the package 100 is a current measurement device. Current flows in through one or more leads coupled to the pad 114, flows through the adhesive 115 and the heat-generating device 116 (e.g., metallic shunt, an alloy), through the adhesive 113 and pad 112, and out the leads 104 coupled to the pad 112. (In some examples, current flows in the reverse direction.) The pins 118, 120 and wires 122, 124 are usable to measure differential voltage between the pins 118, 120. For example, the leads 104A, 104B may be coupled together, and the leads 104C, 104D may be coupled together, thereby providing the die 108 electrical accesses to the pins 118, 120 and enabling the die 108 to measure a voltage between the pins 118, 120. The die 108 can use this measured voltage, in tandem with a known (e.g., programmed) resistance between the pins 118, 120, to calculate the current passing through the heat-generating device 116 and the leads 104 using Ohm's law. However, in some examples, the heat-generating device 116 is not used for current measurement, and in some such examples, the pins 118, 120 and wires 122, 124 may be omitted.

Regardless of the function of the heat-generating device 116, the pads 112, 114, which thermally and electrically couple to the heat-generating device 116, absorb heat generated by the heat-generating device 116. The pads 112, 114 are exposed to an exterior of the package 100, for example by being approximately flush with a surface of the mold compound 102. In this manner, heat generated by the heat-generating device 116 is expelled from within the package 100, and the deleterious consequences of excessive heat within the package 100 as described above are mitigated. Heat generated by the die 108 may be expelled via adhesive 110 and the die pad 106, which is also exposed to an exterior of the package 100 (e.g., by being approximately flush with a surface of the mold compound 102).

Figure 2:
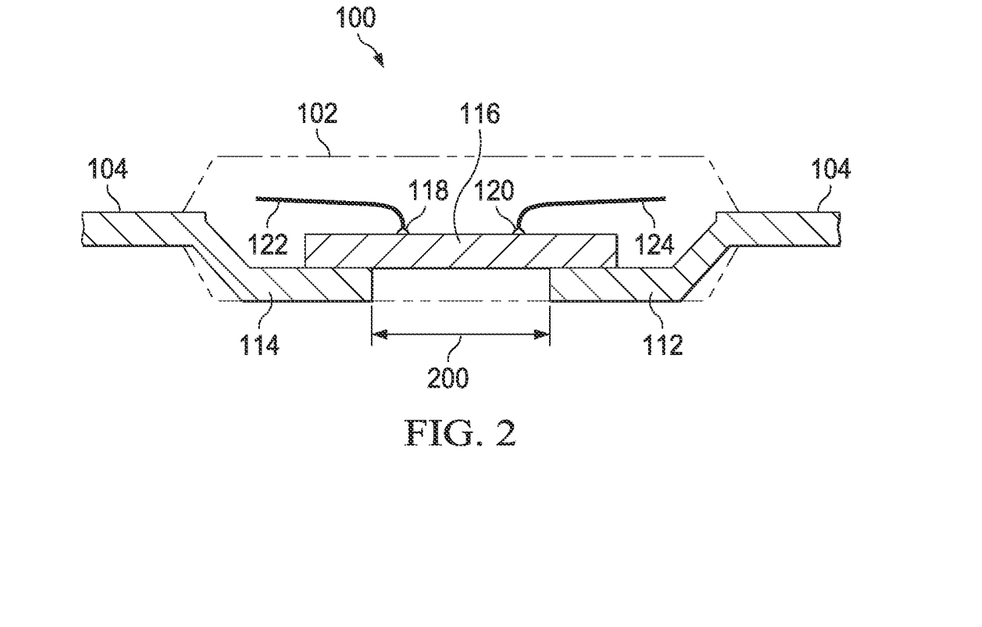
FIG. 2 is a cross-sectional view of contents of a package with multiple exposed pads, in accordance with various examples.

FIG. 2 is a cross-sectional view of contents of the package 100 with multiple exposed pads, in accordance with various examples. Specifically, the cross-sectional view of FIG. 2 is along the dashed line 130 of FIG. 1. FIG. 2 depicts the mold compound 102 encasing pads 112, 114 and the heat-generating device 116 coupling to the pads 112, 114. The mold compound 102 also encases the pins 118, 120 and wires 122, 124. A gap 200 is present between the pads 112, 114. In an example, the gap 200 is between approximately 200 and 750 microns in width from the pad 112 to the pad 114. In an example, this width is 1000 microns to 2000 microns. In an example, the vertical thickness of the gap 200 is approximately 100 to 400 microns. The pads 112, 114 are exposed to an exterior of the package 100, for example by being approximately flush with the bottom surface of the mold compound 102. The leads 104 are partially encased within the mold compound 102. Adhesives, such as the adhesives 110, 113, 115 of FIG. 1, are omitted for clarity. As explained above, heat generated by the heat-generating device 116 is expelled from the package 100 via the pads 112, 114.

Figure 3:
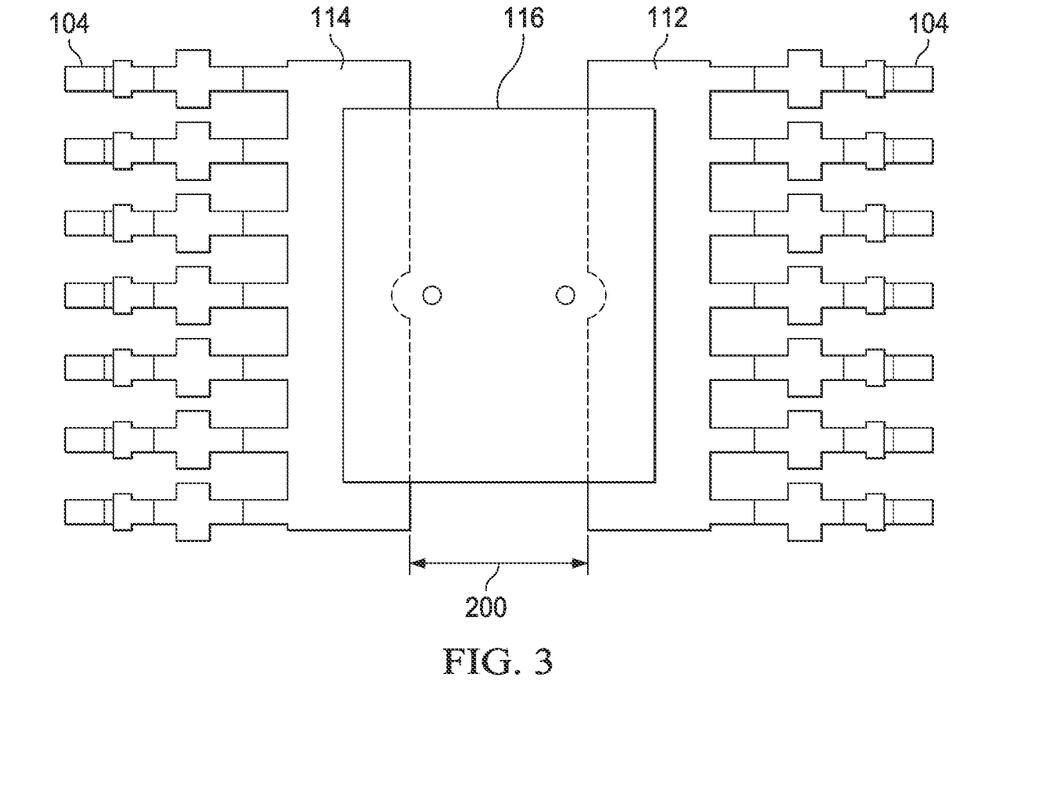
FIG. 3 is a top-down view of contents of a package with multiple exposed pads, in accordance with various examples.

FIG. 3 is a top-down view of contents of the package 100 with multiple exposed pads, in accordance with various examples. Specifically, FIG. 3 depicts the heat-generating device 116, the pads 112, 114, and the leads 104 of the package 100. In the example of FIG. 3, the front-to-rear length of the heat-generating device 116 is less than the front-to-rear lengths of the pads 112, 114. In another example, the front-to-rear length of the heat-generating device 116 is approximately the same as the front-to-rear lengths of the pads 112, 114. In an example, the front-to-rear lengths of the pads 112, 114 are approximately 2000 to 4000 microns, and the front-to-rear length of the heat-generating device 116 is approximately 1000 to 2000 microns. In some examples, these dimensions are reversed such that the heat-generating device 116 has a larger dimension than the pads 112, 114. Other dimensions may be used. The gap 200 separates the pads 112, 114.

Figure 4:
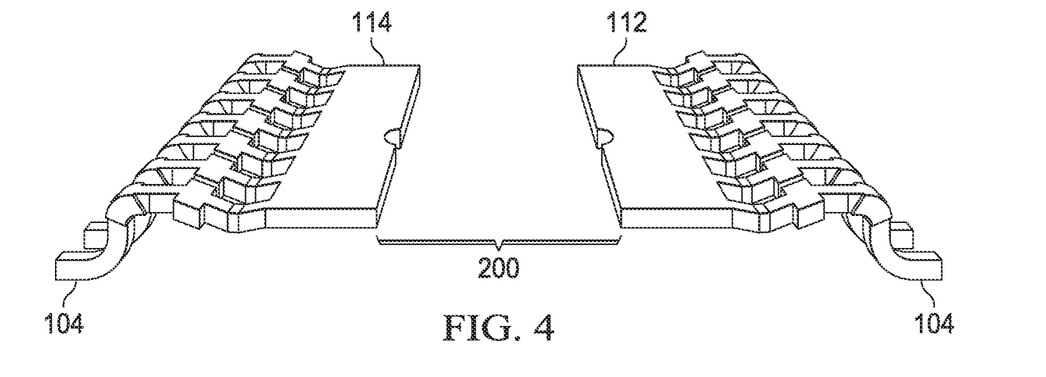
FIG. 4 is another perspective view of contents of a package with multiple exposed pads, in accordance with various examples.

FIG. 4 is another perspective view of contents of the package 100 with multiple exposed pads, in accordance with various examples. Specifically, FIG. 4 depicts the pads 112, 114, the leads 104, and the gap 200 between the pads 112, 114.

Figure 5:
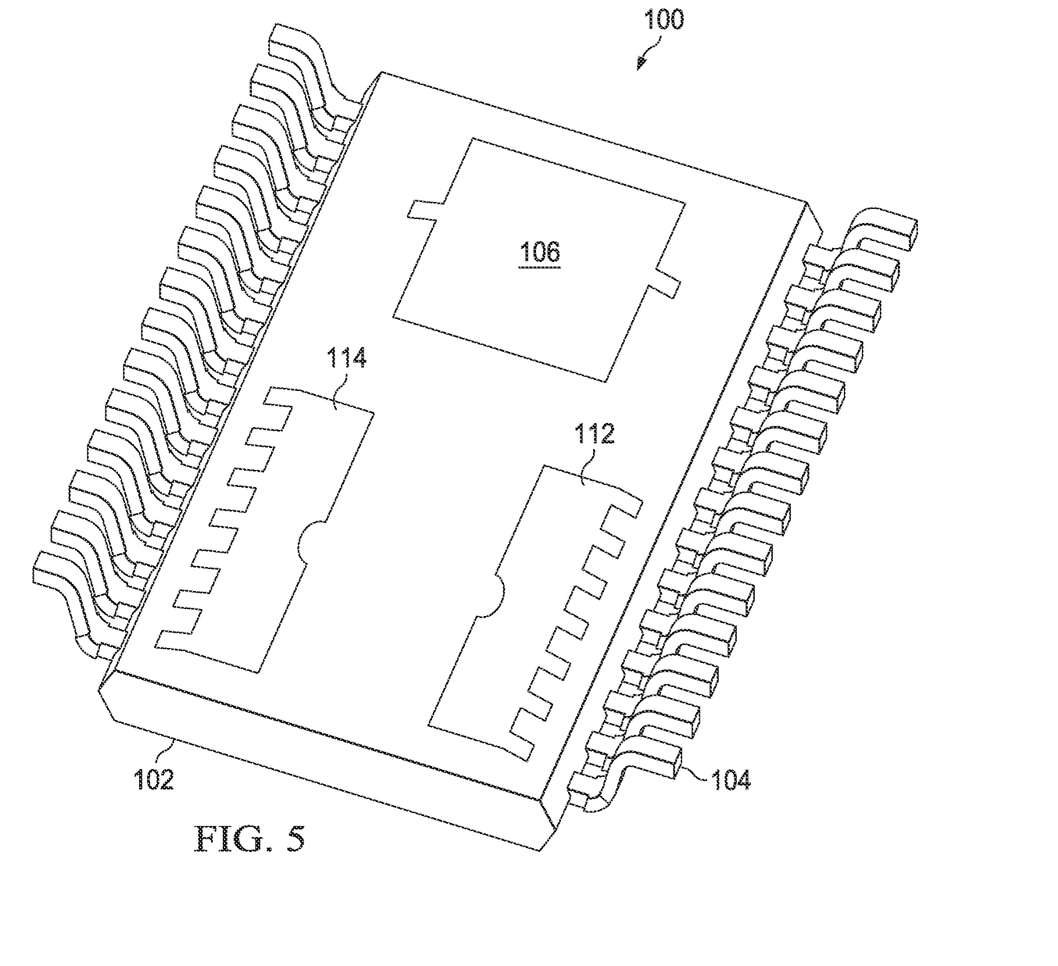
FIG. 5 is a perspective view of the outer features of a package with multiple exposed pads, in accordance with various examples.

FIG. 5 is a perspective view of the outer features of the package 100 with multiple exposed pads, in accordance with various examples. Specifically, FIG. 5 shows a bottom surface of the package 100, with the mold compound 102, the leads 104, the die pad 106, and the pads 112, 114 depicted. As shown, the die pad 106 and the pads 112, 114 are exposed to an exterior of the package 100. Specifically, the die pad 106 and the pads 112, 114 are flush with the bottom surface of the mold compound 102. Heat is expelled from the heat-generating device 116 to an exterior of the package 100 via the pads 112, 114 and from the die 108 via the die pad 106.

Figure 6:
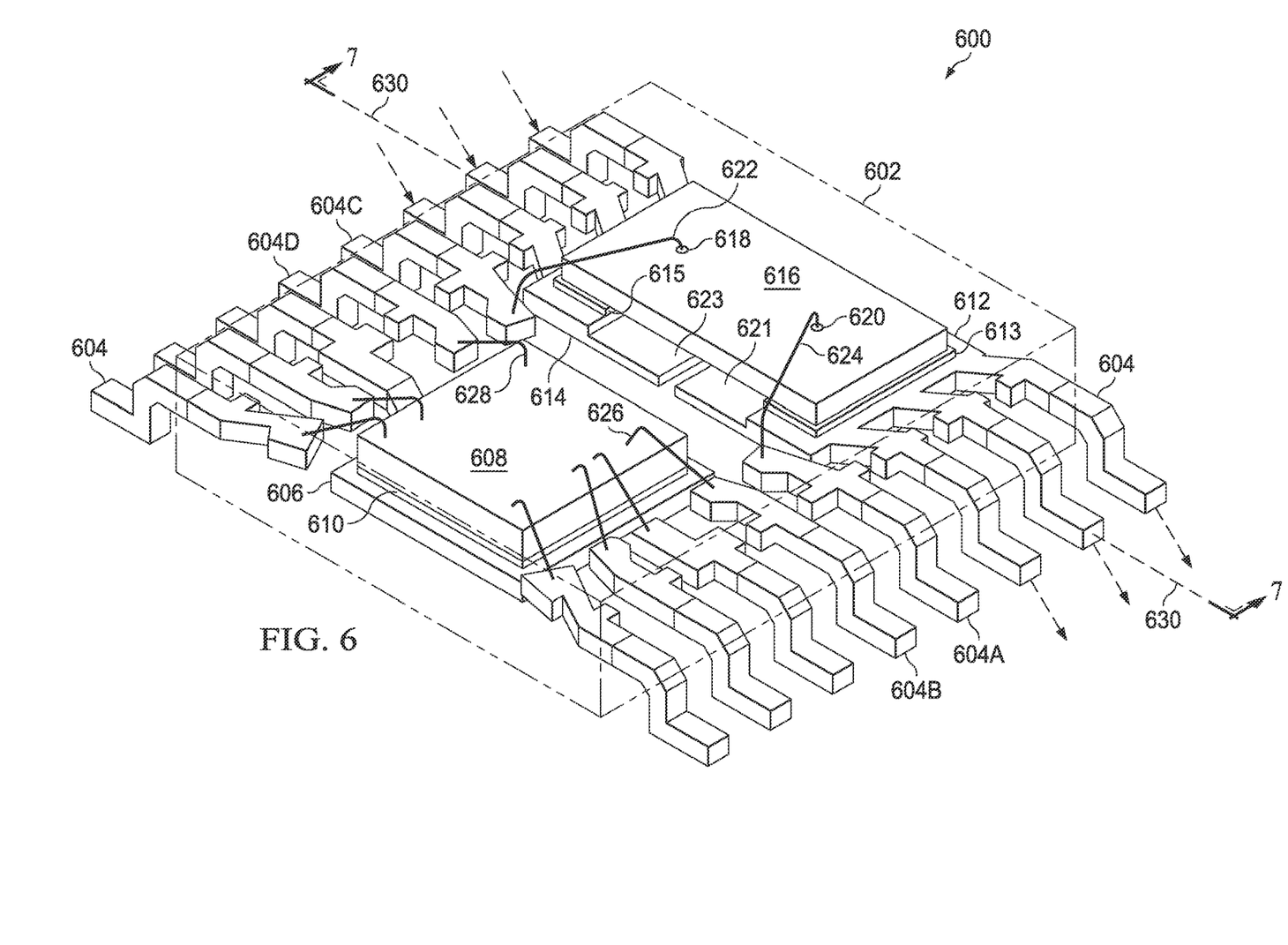
FIG. 6 is a perspective view of contents of a package with multiple exposed pads, in accordance with various examples.

FIG. 6 is a perspective view of contents of a package 600 with multiple exposed pads, in accordance with various examples. The package 600 is virtually identical to the package 100 described above, with like numerals referring to like components. The package 600 differs from the package 100 in that the pads 612, 614 are shaped differently than the pads 112, 114. Specifically, while the pads 112, 114 are of substantially uniform thickness, each of the pads 612, 614 has a recessed area and a non-recessed area. The pad 612 has a recessed area 621, and the remainder of the pad 612 is a non-recessed area. The pad 614 has a recessed area 623, and the remainder of the pad 614 is a non-recessed area. The heat-generating device 616 couples directly to the non-recessed areas of the pads 612, 614, but the heat-generating device 616 does not couple directly to or otherwise contact the recessed areas 621, 623 of the pads 612, 614.

The recessed areas 621, 623 present multiple advantages. For example, when the heat-generating device 616 is coupled to the pads 612, 614 using, e.g., solder, the solder can flow away from the points of contact between the heat-generating device 616 and the pads 612, 614. The recessed areas 621, 623, however, preclude solder flow from reaching the gap between the recessed areas 621, 623, since as a practical matter the solder flow is likely to terminate prior to reaching the gap between the recessed areas 621, 623. In this way, cosmetic defects are avoided. In addition, the recessed areas 621, 623 form part of the pads 612, 614, thereby increasing the surface area of the pads 612, 614 and providing for greater heat dissipation. In this manner, the package 600 provides solutions to the problems described above. In addition, the recessed areas 621, 623 may not directly contact the pins 618, 620. Thus, the known resistance associated with the pins 618, 620 is unchanged for current calculation purposes, and improved heat dissipation is also achieved.

Figure 7:
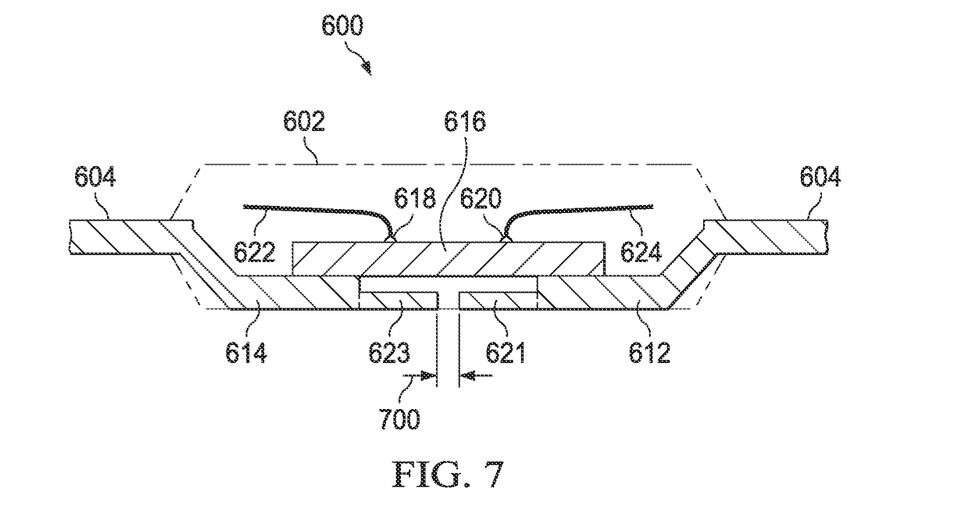
FIG. 7 is a cross-sectional view of contents of a package with multiple exposed pads, in accordance with various examples.

FIG. 7 is a cross-sectional view of contents of the package 600 with multiple exposed pads, in accordance with various examples. The package 600 is virtually identical to the package 100, with like numerals referring to like components. However, the pads 612, 614 include the recessed areas 621, 623, respectively. A gap 700 is present between the recessed areas 621, 623. In examples, the gap 700 has a width of approximately 50 to 200 microns between the recessed areas 621, 623. In an example, this width is between 1000 to 2000 microns. In an example, the gap 700 has a vertical thickness from the bottom surface of the package 600 to the bottom surface of the heat-generating device 616 of approximately 100 to 400 microns. In an example, the recessed areas 621, 623 have vertical thicknesses of approximately 50 to 200 microns. In an example, the non-recessed areas of the pads 612, 614 have vertical thicknesses of approximately 100 to 400 microns. In an example, the recessed areas are approximately half the thickness of the non-recessed areas. As explained above, when the heat-generating device 616 is coupled to the pads 612, 614 using, e.g., solder, the solder flows but does not reach the gap 700 due to the presence of the recessed areas 621, 623. In this way, cosmetic defects are avoided. In addition, the additional heat-dissipating surface area provided by the recessed areas 621, 623 provides for more efficient cooling of the package 600.

Figure 8:
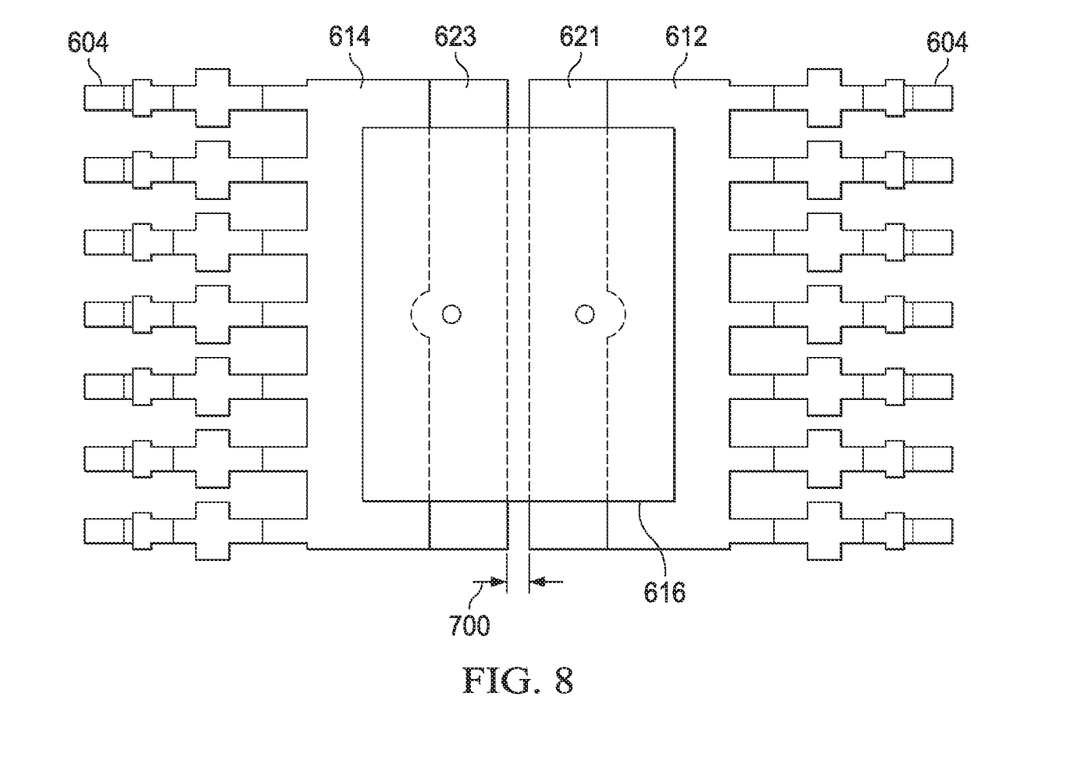
FIG. 8 is a top-down view of contents of a package with multiple exposed pads, in accordance with various examples.
Figure 9:
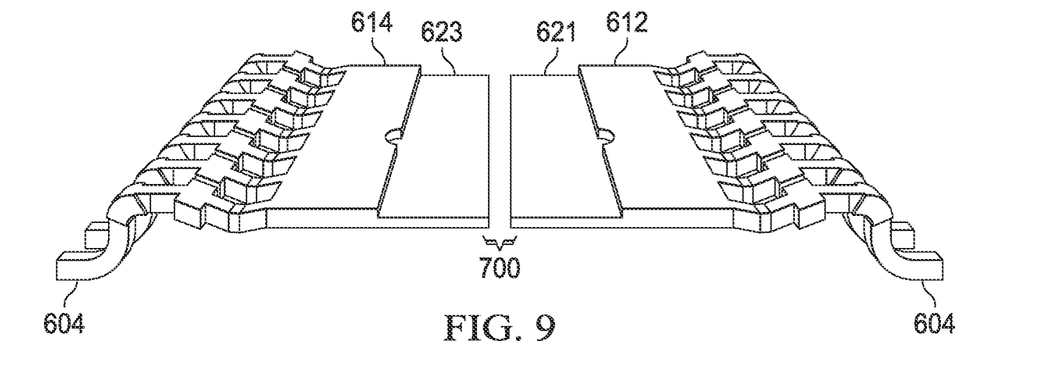
FIG. 9 is another perspective view of contents of a package with multiple exposed pads, in accordance with various examples.

FIG. 8 is a top-down view of contents of the package 600 with multiple exposed pads, in accordance with various examples. The package 600 is virtually identical to the package 100, with like numerals referring to like components. FIG. 9 is another perspective view of contents of the package 600 with multiple exposed pads, in accordance with various examples. The package 600 is virtually identical to the package 100, with like numerals referring to like components.

Figure 10:
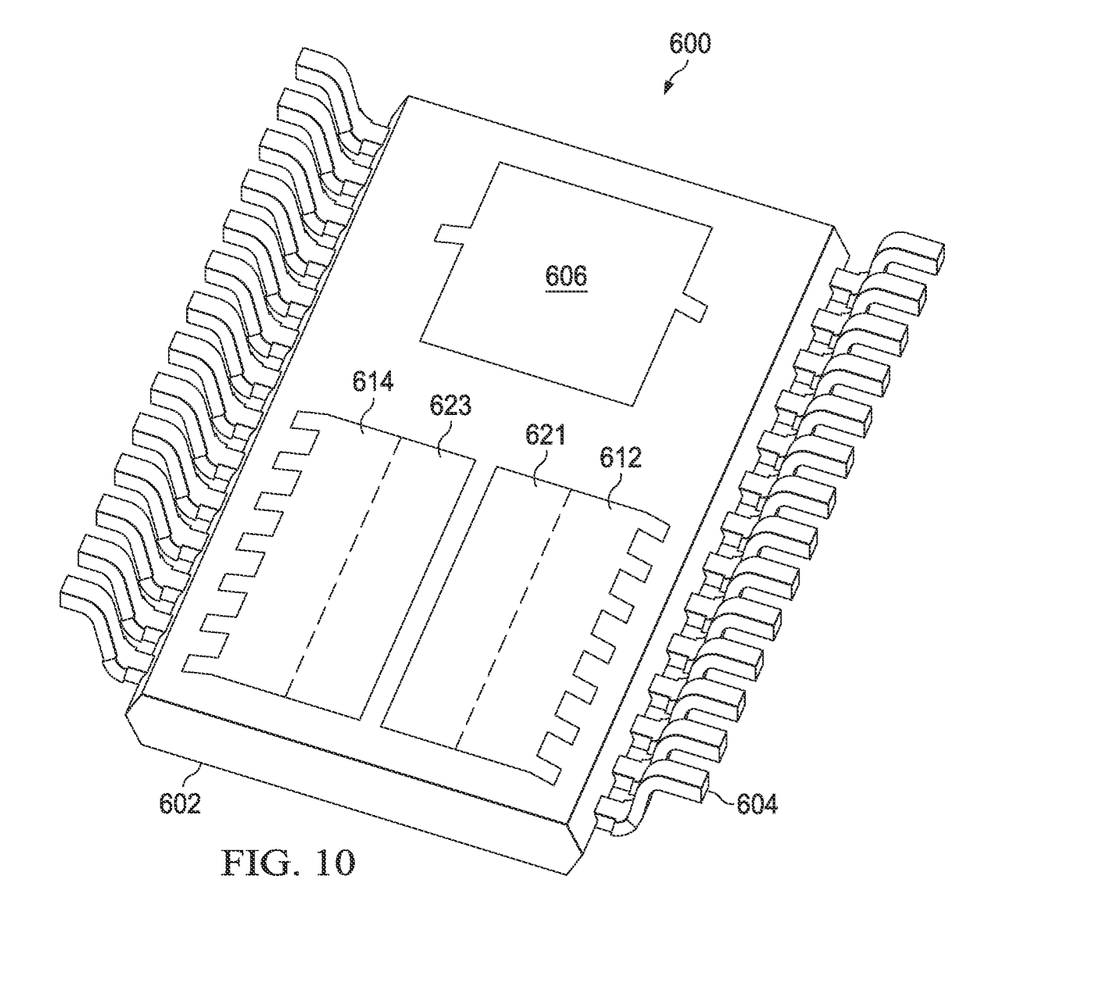
FIG. 10 is a perspective view of the outer features of a package with multiple exposed pads, in accordance with various examples.

FIG. 10 is a perspective view of the outer features of the package 600 with multiple exposed pads, in accordance with various examples. Specifically, the package 600 includes the mold compound 602 and leads 604 extending from within the mold compound 602. The die pad 606 is exposed to an exterior of the package 600, for example by being approximately flush with a bottom surface of the mold compound 602. Similarly, the pad 612, which includes the recessed area 621, is exposed to an exterior of the package 600, for example by being approximately flush with a bottom surface of the mold compound 602. Likewise, the pad 614, which includes the recessed area 623, is exposed to an exterior of the package 600, for example by being approximately flush with a bottom surface of the mold compound 602. The gap between the recessed areas 621, 623 is smaller than the gap between the pads 112, 114 as shown in FIG. 5.

Figure 11:
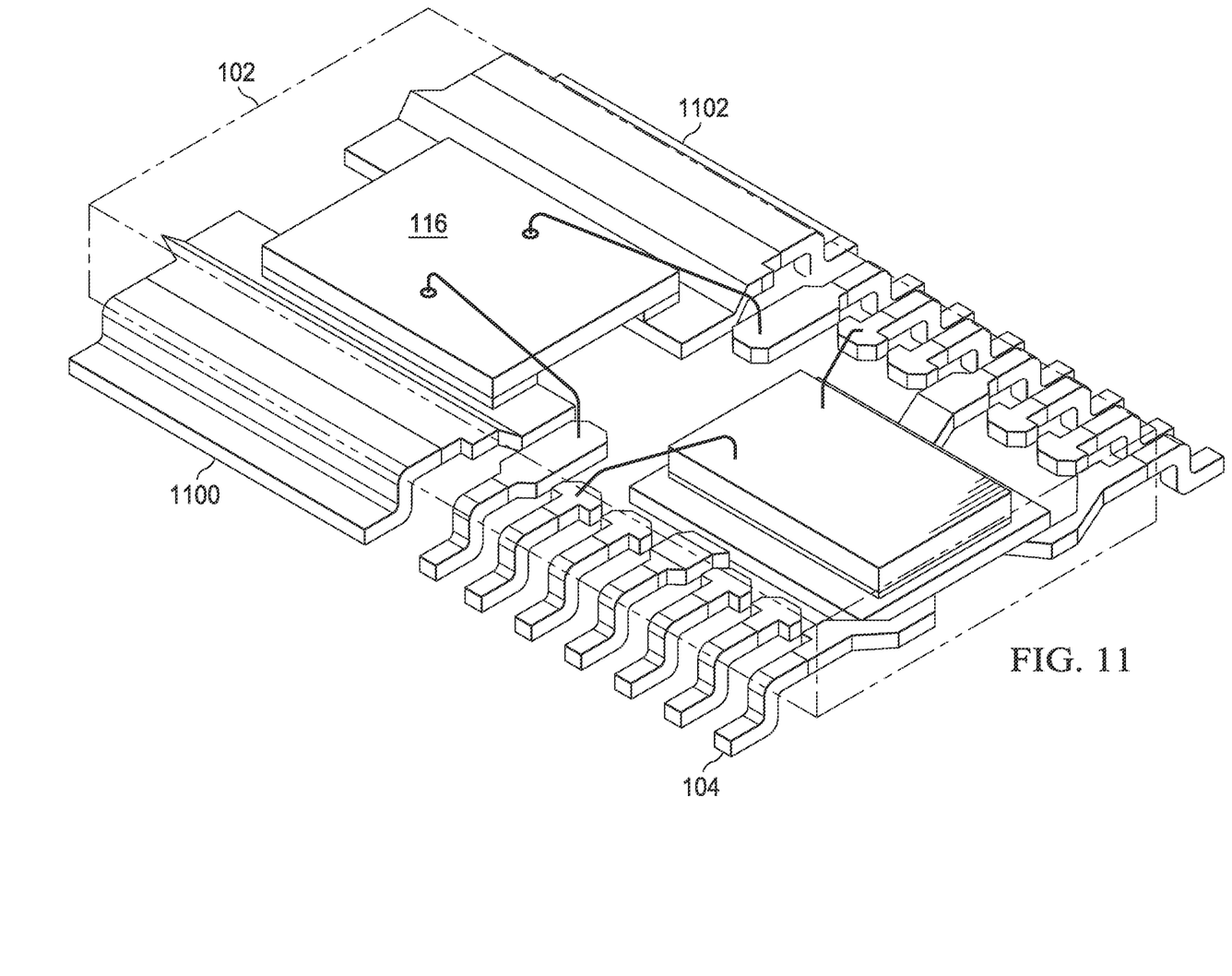
FIG. 11 is a perspective view of a package with fused leads and multiple exposed pads, in accordance with various examples.

FIG. 11 is a perspective view of the package 100 with fused leads and multiple exposed pads, in accordance with various examples. Specifically, multiple leads 104 are fused to form fused leads 1100 and 1102. In some examples, each of the fused leads 1100 and 1102 is a solid electrically conductive member with a substantially uniform thickness. In some examples, each of the fused leads 1100 and 1102 has a gullwing shape. By fusing the leads 104 in this manner (e.g., using any suitable metal or other electrically conductive material), current throughput through the package 100 is increased. Similar fused leads may be used in the package 600.

Figure 12:
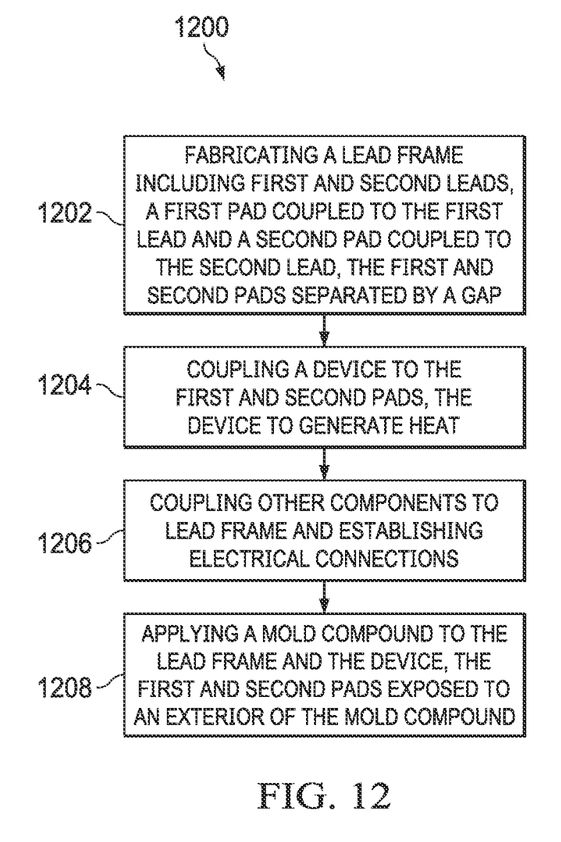
FIG. 12 is a flow diagram of a method for fabricating a package with multiple exposed pads, in accordance with various examples.

FIG. 12 is a flow diagram of a method 1200 for fabricating a package with multiple exposed pads, in accordance with various examples. For example, the method 1200 may be used to fabricate a package with pads of substantially uniform thickness, as in package 100, and it also may be used to fabricate a package with recessed and non-recessed areas, as in package 600. The method 1200 begins by fabricating a lead frame including first and second leads, with a first pad coupled to the first lead and a second pad coupled to the second lead, where the first and second pads are separated by a gap (step 1202). In some examples, the first and second pads are as shown and described above with respect to the package 100, and in other examples, the first and second pads are as shown and described above with respect to the package 600. The lead frame fabrication may occur using any suitable process. In some examples, a thin metal sheet is stamped using a mold to produce a lead frame as in package 100 or as in package 600. In some examples, a thin metal sheet is etched to produce a lead frame as in package 100 or as in package 600. For example, the recessed areas of the pads 612, 614 may be formed using an etching technique.

The method 1200 continues by coupling a device to the first and second pads, where the device is capable of generating heat (step 1204). For example, the device is a shunt or an integrated circuit die. The method 1200 still further comprises coupling other components (e.g., various integrated circuits) to the lead frame and establishing electrical connections using solder balls, wire bonds, and the like (step 1206). The method 1200 then comprises applying a mold compound to the lead frame, the device, and any other components of the package, where the first and second pads are exposed to an exterior of the mold compound (step 1208).

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method comprising:
fabricating a lead frame including first and second leads, a first pad coupled to a first portion of the first lead that is noncoplanar with the first pad, the first lead extending into a second portion that is coplanar with the first pad and a second pad coupled to a first portion of the second lead that is noncoplanar with the second pad, the second lead extending into a second portion that is coplanar with the second pad, the first and second pads separated by a gap;
coupling a device to the first and second pads; and
applying a mold compound to the lead frame and the device,
wherein the first and second pads are exposed to an exterior of the mold compound.

2. The method of claim 1, wherein:
the first pad has a first recessed area and a first non-recessed area;
the second pad has a second recessed area and a second non-recessed area; and
coupling the device to the first and second pads comprises soldering the device to the first non-recessed area and causing solder material to flow into the first recessed area.

3. The method of claim 1, wherein fabricating the lead frame comprises using a stamping technique or an etching technique.

4. The method of claim 1, wherein the device comprises a shunt.

5. The method of claim 1, wherein the first and second leads comprise gullwing leads.

6. The method of claim 1, wherein fabricating the lead frame comprises forming the first pad such that it has a substantially uniform thickness.

7. The method of claim 1, wherein the first pad has a recessed area and a non-recessed area, and wherein the recessed area has a thickness approximately half that of the non-recessed area.

8. A method of making an apparatus, comprising:
coupling a first pad to a first row of leads, at least one of the leads in the first row of leads having a first portion that is noncoplanar with the first pad, the first portion extending into a second portion that is coplanar with the first pad and coupling a second pad to a second row of leads, at least one of the leads in the second row of leads having a second portion that is noncoplanar with the second pad, the first portion extending into a second portion that is coplanar with the second pad, the first and second pads separated by a gap, each of the first and second pads having a substantially uniform thickness; and
coupling a device to the first and second pads, wherein the first and second pads are exposed to an exterior of the apparatus.

9. The method of claim 8, wherein the device comprises a shunt.

10. The method of claim 8, wherein the first and second rows of leads comprise gullwing leads.

11. The method of claim 8, further including mounting a controller on a third pad, the controller coupled to the device and configured to determine a current flowing through the device based on a differential voltage across the device.

12. The method of claim 8, wherein multiple leads in the first row of leads are fused.

13. The method of claim 8, wherein the gap has a width between approximately 1000 microns to 2000 microns.

14. A method of making an apparatus, comprising:
coupling a first pad to a first lead, the first pad comprising a first recessed area and a first non-recessed area, a first portion of the first lead being noncoplanar with the first pad, the first lead extending into a second portion that is coplanar with the first pad;
coupling a second pad to a second lead, the second pad comprising a second recessed area and a second non-recessed area, a first portion of the second lead being noncoplanar with the second pad, the second lead extending into a second portion that is coplanar with the second pad, the first and second recessed areas separated by a first gap; and
coupling a device to the first and second non-recessed areas, the device separated from the first recessed area by a second gap and the device separated from the second recessed area by a third gap, wherein the first and second pads are exposed to an exterior of the apparatus.

15. The method of claim 14, wherein the first gap has a vertical dimension of between 100 microns and 400 microns.

16. The method of claim 14, wherein the first non-recessed area has a thickness that is approximately twice that of the first recessed area.

17. The method of claim 14, wherein the first and second leads are gullwing leads.

18. The method of claim 14, wherein the device is a shunt.

19. The method of claim 14, wherein the first lead is fused with another lead.

20. The method of claim 14, wherein the first gap has a width between approximately 1000 microns and 2000 microns.

21. The method of claim 1, wherein the first and second leads comprise gullwing portions extending away from the mold compound.

22. The method of claim 8, wherein the first and second rows of leads comprise gullwing portions extending away from the exterior of the apparatus.

23. The method of claim 14, wherein the first lead comprises a gullwing portion extending away from the exterior of the apparatus.

* * * * *